United States Patent [19]

Kuznetsov

[11] Patent Number: 5,333,219
[45] Date of Patent: Jul. 26, 1994

[54] ASYMMETRIC Y-BRANCH OPTICAL DEVICE

[75] Inventor: Mark E. Kuznetsov, East Brunswick, N.J.

[73] Assignee: AT&T Bell Laboratories, Murray Hill, N.J.

[21] Appl. No.: 992,352

[22] Filed: Dec. 17, 1992

[51] Int. Cl.$^5$ ................................. G02B 6/26
[52] U.S. Cl. ......................... 385/45; 385/50; 372/50; 359/341
[58] Field of Search ............ 385/45, 46, 48, 50; 372/7, 45, 50; 359/341

[56] References Cited

U.S. PATENT DOCUMENTS

| | | | |
|---|---|---|---|
| 4,609,252 | 9/1986 | Wong et al. | 385/143 |
| 4,674,827 | 6/1987 | Izutsu et al. | 385/45 |
| 4,760,580 | 7/1988 | Thompson et al. | 372/50 |
| 5,003,550 | 3/1991 | Welch et al. | 372/50 |
| 5,016,960 | 5/1991 | Eichen et al. | 385/45 |
| 5,046,800 | 9/1991 | Blyler, Jr. et al. | 385/131 |

OTHER PUBLICATIONS

"Integrated Interferometric Injection Laser: Novel Fast and Broad-Band Tunable Monolithic Light Source" M. Schilling, et al., IEEE J. Quantum Electronics, vol. 27, No. 6, Jun. 1991 pp. 1616–1624.

"Multibranch Frequency-Selective Reflectors and Application to Tunable Single-Mode Semiconductor Lasers" S. E. Miller, J. Lightwave Technology, vol. 7, No. 4, Apr. 1989, pp. 666–673.

"Asymmetrical Y Laser With Simple Single Current Tuning Response" M. Schilling et al., Electronics Letters, vol. 28, No. 18, Aug. 1992, pp. 1698–1699.

*Primary Examiner*—Frank Gonzalez
*Attorney, Agent, or Firm*—Gregory C. Ranieri

[57] ABSTRACT

The present invention relates to a new tunable filter which, when used as an intracavity mode selecting filter in a semiconductor laser structure, provides a large tuning range. The disclosed filter is, in one embodiment, a two branch asymmetric Y-branch tunable filter where the ends of the two branches terminate at a common plane. In another embodiment, the invention is realized by using a cascade of two or more Y-branches to place several asymmetrical Y-branch filters in parallel.

14 Claims, 3 Drawing Sheets

ASYMMETRIC Y-BRANCH OPTICAL DEVICE

TECHNICAL FIELD

This invention relates to asymmetric Y-branch optical filters which can be used as intracavity mode selecting filters in semiconductor lasers to provide large tuning ranges.

BACKGROUND OF THE INVENTION

Tunable single-mode lasers are essential elements in high information rate optical telecommunication systems. The single mode feature avoids pulse dispersion in long spans and high data rate applications. The tunability feature facilitates assembling a series of channels in a densely packed wavelength division multiplexed (WDM) configuration.

The traditional tunable semiconductor lasers such as the distributed feedback (DFB) laser and distributed Bragg reflector (DBR) laser can, at best, produce optical frequency shifts which are directly proportional to the induced change in the refractive index in the semiconductor. This frequency shift is too limited for a wavelength division multiplex multichannel optical communication system which is typically characterized by 20 or more channels with a frequency separation of 20 to 100 GHz. This invention is directed toward an optical filter which can be located inside the cavity of a semiconductor laser to provide a tunable laser which has a wide tuning range and can be used with a WDM multichannel optical communication system.

SUMMARY OF THE INVENTION

The present invention relates to a new filter which can be used as an intracavity mode selecting filter in a semiconductor laser structure to provide a very large tuning range. The disclosed invention is a two branch asymmetric Y-branch mode selecting filter. Embodiments of this invention can provide optical frequency shifts that are at least as high as 4.1 THz. In a two-branch asymmetric Y-branch filter, the underlying frequency selective mechanism is that of a Mach-Zehnder interferometer which leverages the refractive index change to produce large filter frequency shifts. This is done by comparing the phase change in one branch of the interferometer to the phase difference between the two branches of the interferometer.

In the asymmetric Y-branch filter disclosed the ends of the two branches terminate in a common plane that is normal to the longitudinal axes of the two branches. Terminating the two branches at a common plane, as opposed to terminating the two branches at two different planes not only simplifies the manufacturing process, but also facilitates its connections to other components. The tuning range and the side-mode suppression of the two branch asymmetric Y-branch tunable laser can be improved by placing two different asymmetrical Y-branch optical elements in cascade. In this embodiment, the filters can be viewed as two Mach-Zehnder interferometer filters, one being a fine filter with a large length difference, and the other being a coarse filter with a small length difference. The use of two asymmetrical Y-branches in cascade represents a significant advance over the single two branch asymmetric Y-branch filter because it achieves a significantly wider tuning range with better side-mode suppression and can retain a simple single-knob control of the tuning of the filter. In one embodiment of the invention, a tuning range of 4080 GHz with access to 81 frequency channels having 50 GHz channel separation is achievable.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Electronically tunable semiconductor lasers are required for a variety of applications, one of them being for wavelength division multiplex (WDM) multi-channel optical communications systems. The characteristics desired for such lasers are a wide tuning range, a large number of accessible frequency channels and a simple frequency control. In addition, discrete tuning and fast channel switching time are desirable for packet switched WDM networks.

Prior art tunable laser structures such as distributed Bragg reflector (DBR) lasers can, at best, produce optical frequency shifts which are in direct proportion to the refractive index change induced in the semiconductor. With the achievable index change, which is less than 1%, the frequency shift is limited to less than 2 THz at the wavelength of 1.55 μm.

Figure 1:
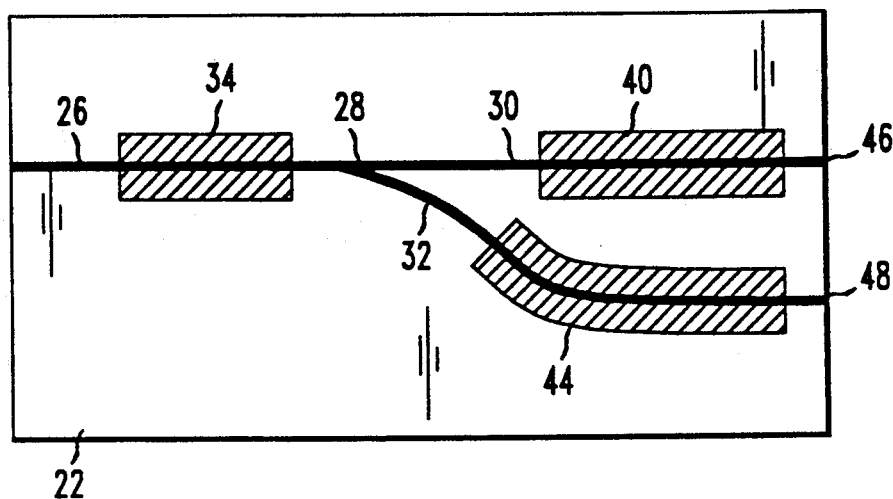
FIG. 1 illustrates an asymmetric Y-branch optical device which can be used as an intracavity mode selecting filter in a semiconductor laser.

In this invention, there is disclosed an asymmetric Y-branch optical filter which, when used with an active semiconductor gain element forms a Mach-Zehnder interferometer type of laser cavity which has a wide tuning range, fast electronic frequency access, and simple current control. Referring to FIG. 1, there is illustrated a schematic diagram of a Mach-Zehnder interferometer intracavity filter in accordance with the principle of the invention.

In particular, the interferometer 20 is comprised of optical waveguides formed in a semiconductor material 22, such as indium phosphide (InP). The array of optical waveguides is constructed to include a first branch 26 coupled, via a Y-junction element 28 to both a second branch 30 and a third branch 32. The two branches 30 and 32 of the asymmetric Y-branch terminate at points 46 and 48 in a common plane which is perpendicular to the axes of propagation for the two waveguides. This common reflecting plane can be formed, for example, by cleaving the semiconductor crystal at this position. If desired, the cleaved facet can be reflection coated. The two branches 30 and 32 of the asymmetric Y-branch have different lengths, which is necessary for the proper operation of the Mach-Zehnder interferometer. Three controlling electrodes 34, 40, and 44 are placed over the corresponding branches 26, 30, and 32. For the device in FIG. 1, all three branches 26, 30, and 32 can be active. This is, they can each have gain. Alternatively, all three can be passive, that is without gain, for making an optical filter. Also, some branches can be active while others can be passive, such as branch 26 can be active to provide gain, while branches 30 and 32 can be passive to provide tuning. The assemblage of the semiconductor substrate with an optical Y-junction, the associated optical waveguides and electrodes is a folded manifestation of a tunable interferometer normally identified as a Y-branch Mach-Zehnder interferometer.

Unfolding the asymmetric Y-branch optical element at the right facet illustrates clearly that a Mach-Zehnder interferometer is the underlying frequency selective mechanism.

The traditional tunable laser structure using distributed feedback (DFB) lasers and distributed Bragg reflector (DBR) lasers can, at best, produce optical frequency shifts ($\Delta f$) which are in direct proportion to the induced refractive index change ($\Delta n$), that being $\Delta f/f = -\Delta n/n$.

In this invention, it is discrete or mode-hop tuning that is used to overcome the barrier imposed by the limited index change of the prior art devices. In this invention an intracavity tunable filter selects a single longitudinal mode from a comb of Fabry-Perot modes of the laser structure.

While the individual Fabry-Perot modes tune by only a small amount, the filter actually leverages the index change to produce large frequency shifts of the transmission peak, that being $\Delta f/f = -\Delta n/n \times$(Lever factor).

One type of filter that gives leverage is the Mach-Zehnder interferometer filter. The principle used to leverage the index change is that the phase change in one branch is compared to the phase difference (geometrical or due to refractive index) between the two branches of the interferometer. For example, in a Mach-Zehnder interferometer with branch lengths $2L_1$ and $2L_2$ and refractive indexes of $n_1$ and $n_2$, the filter transmission is a sinusoidal function of the optical frequency. The transmission peaks $f_m$ tune with the index $n_2$ in branch 2 as $$\delta f_m/\delta n_2 \approx -(f_m/n_2)[L_2/(L_2 - L_1)].$$

The expression in the square brackets is the tuning lever and it is large when the relative arm length difference is small. The index lever is based on the fact that a phase change of $2\pi$ in one branch tunes the filter by one free spectral range (FSR) which is equal to $c/(2L_2n_2 - 2L_1n_1)$ where c is the speed of light. Keeping the length $L_2$ fixed, the same phase change in branch 2 produces very large frequency shifts if FSR is large.

It is to be noted that, in FIG. 1, the length difference ($L_{32} - L_{30}$) is a key parameter of the asymmetric Y-branch filter which allows a degree of freedom which is not available with a symmetric Y-branch filter.

Since the Mach-Zehnder filter has a finesse of only 2, the design of the asymmetric Y-branch laser involves a tradeoff among the free spectral range (which limits the tuning range and the number of accessible frequency channels), the tuning lever, and the filter selectivity (which determines the side-mode suppression ratio of the laser). For a given device length and hence a given mode spacing, larger free spectral (FSR) results in a larger tuning lever and range, but at the expense of a reduced filter selectivity between the main and the side modes. For single mode operation of the laser, a single free spectral range of the Mach-Zehnder filter is selected by the roll-off of the semiconductor material gain with optical frequency.

In one embodiment of an asymmetric Y-branch laser, the lengths of the branches 30, 32 and 26 were 1201 $\mu$m, 1263 $\mu$m, and 300 $\mu$m respectively for a total device length of 1500 $\mu$m. It is to be understood, however, that the exact lengths of the branches depend upon the cleaving positions of the wafer. If an accurate length control is required, the full unfolded Mach-Zehnder interferometer can be included on a laser chip. As is illustrated, the electrodes for the branches 26, 30, 32 are separate and the laser can be tuned with current through branches 30 or 32.

The radiation losses of the waveguide bends and the Y-branching element can be minimized by parabolically tapering the waveguide curvature.

The device of FIG. 1 was fabricated using a semi-insulating buried ridge (SIBR) multiple quantum-well (MQW) transverse laser structure. First, the waveguide structure is grown on InP by low pressure (100 torr) metal organic vapor phase epitaxy (MOVPE); the waveguide consists of a four quantum well, compressively strained InGaAs/InGaAsP active layer, surrounded by two InGaAsP separate confinement layers. Next, the Zn-doped p-type layers are grown on top by the atmospheric pressure (AP) MOVPE. The active ridge structure is produced by a two-step wet chemical etching process. A selective HCl/$H_3PO_4$ etch forms the InP ridge; then the nonselective HBr shallow etch forms the ridge in the quaternary waveguide material, which contains the active MQW layers. Finally, the etched ridges are buried by an iron-doped semi-insulating InP current blocking layer grown by AP-MOVPE. To produce electrical isolation ($\sim$10 k$\Omega$) between the different segments of the AYB laser, reactive ion etching (RIE) is used for a shallow etch into the p-type top material, using the ohmic contact metallization as an etch mask.

The device was tested as cleaved with no facet coatings. The lasing threshold was 65 mA when the electrodes of the three branches were connected in parallel, and the output power reached 13 mW.

Figure 2:
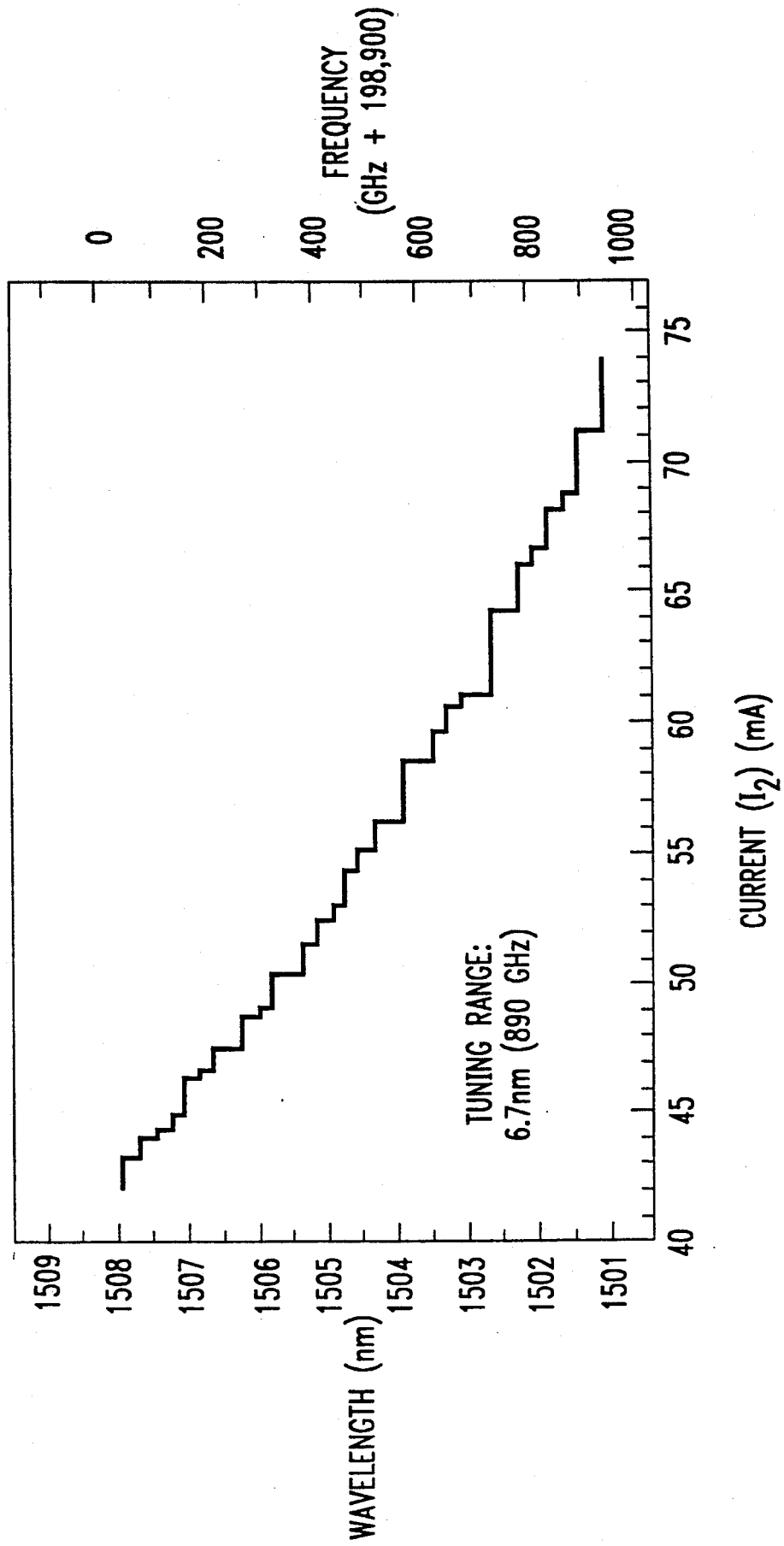
FIG. 2 illustrates the frequency tuning vs. current of a semiconductor laser having an asymmetric Y-branch intracavity mode selecting filter of FIG. 1.

Referring to FIG. 2, there is illustrated the tuning of the invention with current $I_2$ through the electrode for branch 32 while the other two currents are fixed.

Figure 3:
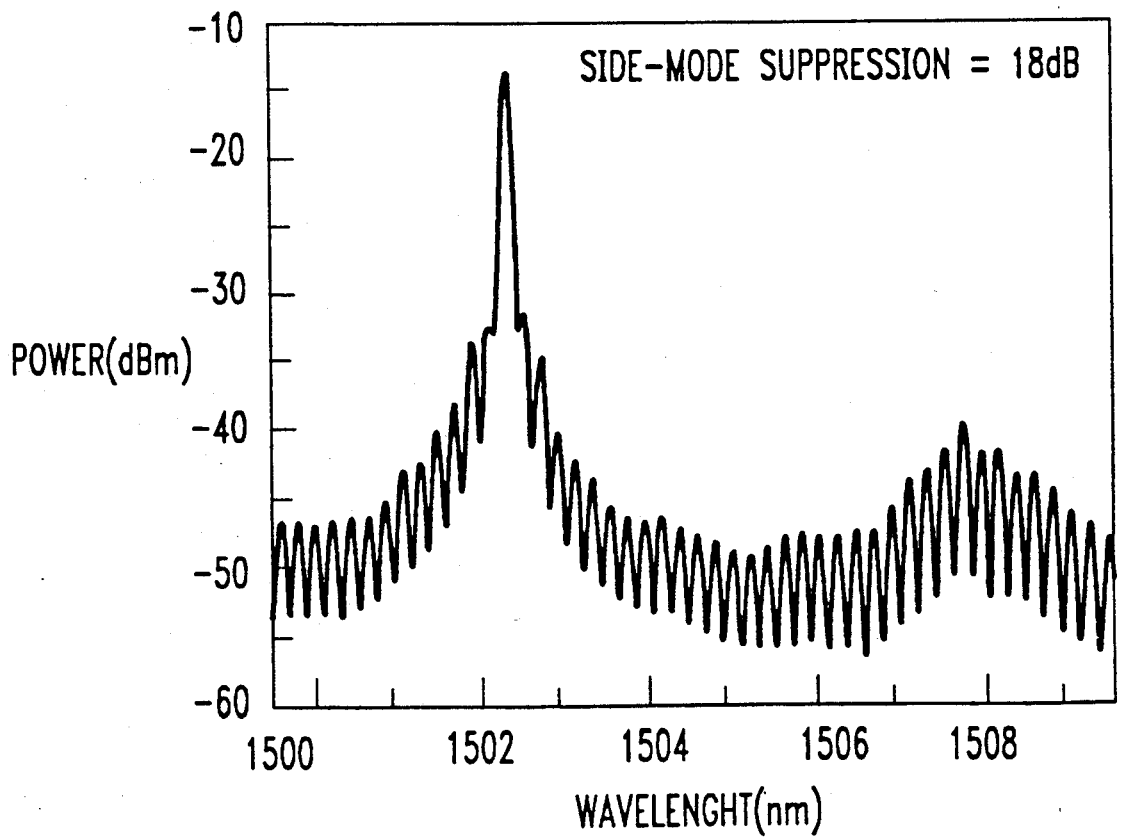
FIG. 3 illustrates the optical spectrum of a semiconductor laser having an asymmetric Y-branch intracavity mode selecting filter, when the side-mode suppression ratio is 18 dB.

With this single-knob control the tuning range in FIG. 2 is 890 GHz (6.7 nm), with the average tuning rate of 29 GHz/mA; at the mode spacing of 27 GHz (0.2 nm) this corresponds to $\sim$1mA/mode (channel). FIG. 3 shows the spectrum of one of the modes where the side mode suppression ratio (SMSR) is 18 dB. The SMSR degrades at the mode-hopping bias points. The Fabry-Perot modes of the structure clearly follow the periodic sinusoidal transmission of the Mach-Zehnder filter with a free spectral range of 730 GHz (5.5 nm, $\sim$26.5 modes). The transmission peak on the right is suppressed because of the semiconductor material gain rolloff. The tuning range is larger than the FSR possibly because the material gain peak shifts to shorter wavelengths with laser tuning.

The two branch asymmetric Y-branch device of FIG. 1 possesses the tuning lever required to achieve a wide frequency tuning range. The intracavity filter selects a single Fabry-Perot mode of the cavity, and the laser tunes with the filter by jumping from mode to mode. The tuning interferometer, the branched portion of the laser structure, can be made with either active or passive waveguides. A limitation of the asymmetric Y-branch tunable semiconductor laser is the low finesse, (F=2) of the simple Mach-Zehnder filter which limits the number of channels given the minimum required side-mode suppression ratio (SMSR) of 15 to 20 dB.

Figure 4:
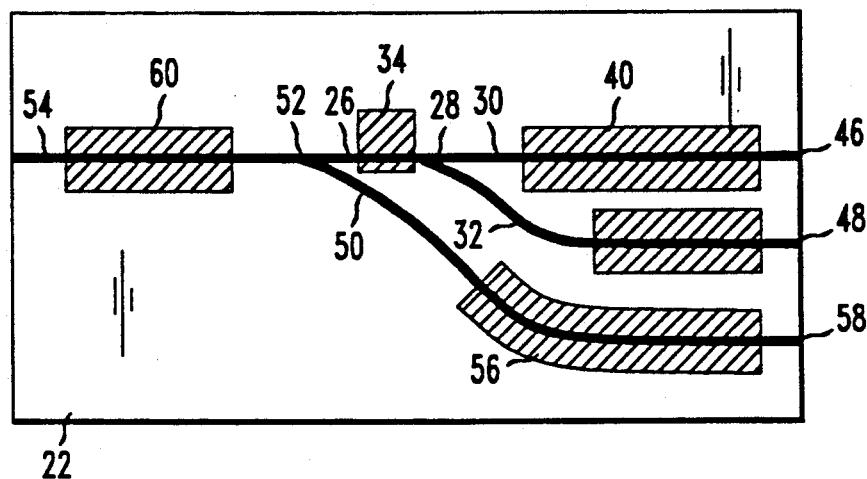
FIG. 4 illustrates another embodiment of the invention where the asymmetric Y-branch mode selecting filter has several branches in cascade.

To improve the tuning range and the side-mode suppression of the asymmetric Y-branch laser, a filter which has higher finesse and preserves the tuning leverage is required. Referring to FIG. 4, there is illustrated an embodiment of the invention which has improved characteristics. FIG. 4 is a schematic diagram of an asymmetric Y-branch optical device having several branches in cascade which can be used as an intracavity mode selecting filter in a semiconductor laser.

The embodiment of FIG. 4 is substantially identical to the embodiment of FIG. 2 with the addition of a fourth and a fifth optical waveguide branch and a second Y-junction element. Branch 54 is coupled via Y-junction element 52 to branch 26 and branch 50. It is to be noted that the Y-junction elements 52, 28 are located in tandem. As with the other branches, the branch 50 can have an electrode 56 and branch 54 can have an electrode 60. In this embodiment, which is similar to the embodiment of FIG. 1, the three branches 30, 32, and 50 of FIG. 4 terminate at points 46, 48 and 58 which lie in a common plane perpendicular to the axes of propagation for the three waveguides. This single common plane serves as a reflector plane which forms the right mirror for the ends of the branches 30, 32 and 50. Again, the device of FIG. 4 can be unfolded at the right mirror facet to form effectively a full three-branch Mach-Zehnder interferometric filter.

It is here noted that several different Mach-Zehnder filters can be placed in series. This arrangement would result in a physically larger device where the reduced Fabry-Perot mode spacing of a longer laser would require tighter filtering. A different approach would be to put the filters in parallel which can be done in a multiple-branch laser with a 1×N splitter. Unfortunately, a compact and low loss 1×N splitter is both difficult and expensive to realize in practice. The new arrangement here disclosed uses a cascade of Y-branches to achieve the parallel operation of several Mach-Zehnder interferometers.

The embodiment of FIG. 4 has, effectively, three cavities $L_x$, $L_y$ and $L_z$. If it is assumed that the branches 30, 32, 50, 26 and 54 have lengths $L_1$, $L_2$, $L_3$, $L_4$ and $L_5$ respectively, then the lengths of the three cavities are as follows: $L_x=(L_5+L_4+L_1)$, $L_y=(L_5+L_4+L_2)$, and $L_z=(L_5+L_3)$.

The interaction between these three cavity lengths can be characterized by two length differences and the device can be viewed as forming, on round trip, two Mach-Zehnder interferometer filters. One is a fine filter having a small free spectral range (FSR) with a large length difference of $2(L_z-L_x)$, and the second is a coarse filter having a large FSR with a small length difference of $2(L_y-L_x)$. Equivalently, the structure can be thought of as being two fine Mach-Zehnder interferometers $2(L_z-L_x)$ and $2(L_z-L_y)$ which are slightly different and which results in a low frequency beat between the two.

For the specific embodiment illustrated in FIG. 4, the lengths of the different segments were set to (30) $L_1=500.0$ μm; (32) $L_2=510.5$ μm; (50) $L_3=803.2$ μm; (26) $L_4=240.2$ μm, and (54) $L_5=85$ μm. It is to be noted that the physical dimensions of different fabricated devices may deviate slightly from the values noted above because of the uncertainty of the semiconductor chip cleavage position. This slight deviation can result in a deviation of the coarse to fine filter ratio and can cause a slow walk off with frequency between the fine and coarse filters. This, however, is not a problem for a tunable device where a large tuning lever of the coarse filter can easily bring the two filters into coincidence at the desired lasing wavelength. In some instances, it may be desirable to have the full three-branch Mach-Zehnder interferometer on a chip, it being understood that the chip will be twice as long.

The Fabry-Perot mode spacing of the laser is given by the expression $$f_{mod} = \frac{c}{2n_g L_d}$$

where $n_g$ is the group index and $$L_d = L_5 + \frac{1}{2}\left(L_3 + L_4 + \frac{1}{2}(L_1 + L_2)\right) =$$

$$\frac{1}{2}\left(L_z + \frac{1}{2}(L_x + L_y)\right)$$

is the effective cavity length for the Fabry-Perot modes. The round trip phase delay in the j-th (j=1-5) laser segment is $\phi_j=2n_j k L_j$, where $n_j$ is the effective index in the segment and $k=2\pi/\lambda$, where $\lambda$ the optical wavelength. The phase of the fine $2(L_z-L_x)$ interferometer is defined as:

$$\phi_f=\phi_3-\phi_4-\phi_1$$

and the coarse $2(L_y-L_x)$ interferometer as:

$$\phi_c=\phi_2-\phi_1$$

The fine interferometer has transmission peaks at frequencies $$F_1 = m_1 \frac{c}{2(n_3 L_3 - n_4 L_4 - n_1 L_1)} = m_1 \frac{2\pi f}{\phi_f}$$

while the coarse interferometer has transmission peaks at $$F_2 = m_2 \frac{c}{2(n_2 L_2 - n_1 L_1)} = m_2 \frac{2\pi f}{\phi_c}$$

where $m_{1,2}$ are integers and f is the optical frequency. The optical length ratio $p_{cf}$ between the fine and the coarse interferometers is defined as $$p_{cf} = \frac{\phi_f}{\phi_c}$$

This is also the ratio between the periods of the coarse and fine interferometers; for equal refractive indices of the segments, we have $$p_{cf} = (L_z - L_x)/(L_y - L_x) = (L_3 - L_4 - L_1)/(L_2 - L_1).$$

The three branches of the device of FIG. 4 form a composite intracavity filter with the following round trip power transmission:

$$T = \frac{1}{4} |e^{j\phi_3} + e^{j\phi_4}(e^{j\phi_1} + e^{j\phi_2})/2|^2 =$$

$$\frac{1}{4} |1 + 0.5e^{-j\phi}[1 + e^{j\phi/p_{cf}}]|^2$$

Figure 5:
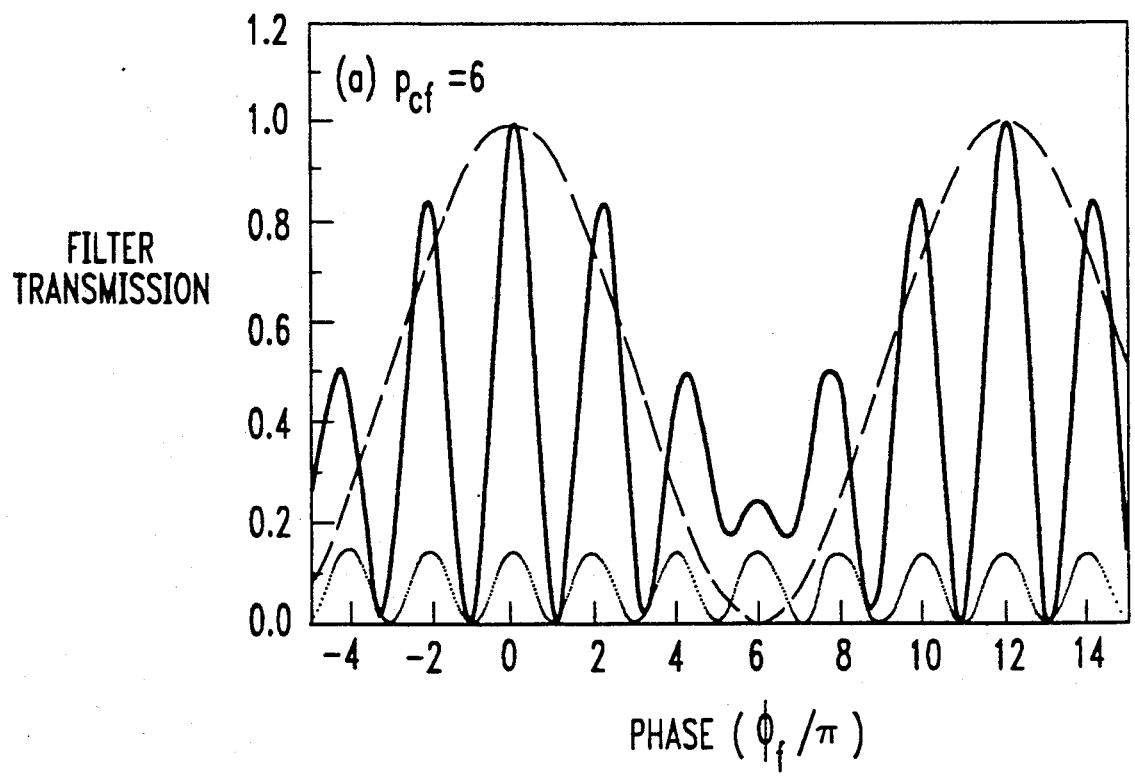
FIG. 5 illustrates the filter transmission function (round trip) of a semiconductor laser having a two-stage asymmetric Y-branch mode selecting filter as in FIG. 4 for $P_{cf}=6$ and a Finesse of 11.1 where the dash line represents the fine interferometer, the dotted line is for the coarse interferometer and the amplitudes of the fine and coarse filters are of arbitrary values for illustrative purposes.

A clean filter operation is obtained if the ratio $p_{cf}$ between the coarse and the fine interferometers is a rational number. FIG. 5 shows the three-branch filter transmission for the case of $p_{cf} = 6$, together with the corresponding fine ($\cos^2(\phi_f/2)$) and coarse ($\cos^2(\phi_c/2)$) filter transmissions. This filter has a finesse of 11. Amplitudes of the fine and coarse filters were chosen arbitrarily for illustration. The fine interferometer transmission corresponds to that of the two-branch laser; the individual peaks have a cosine filter shape. The coarse interferometer selects, periodically, one out of several fine interferometer peaks, leading to a larger free spectral range while maintaining the same width of the main filter lobe. Thus by going from a two- to a three-branch structure, the laser filter finesse can be increased from 2 to 11; correspondingly, the number of channels increases from approximately 20 to 80.

The three-branch device of FIG. 4 is tuned by adjusting currents, and hence refractive indices $n_j$, of the branches. The composite filter tuning is characterized by the tuning coefficients $A_{ij}$ $$\frac{\partial F_i}{\partial n_j} = -\frac{F_i}{n_{j,g}} A_{ij}$$

where $n_{j,g}$ is the group index in the j-th segment. Thus coefficient $A_{ij}$ gives the tuning lever for tuning interferometer i (i=1 (fine) and i=2 (coarse)) due to index change in segment j (j=1-5).

From the two relationships for the interferometer peak transmissions, the following expressions for the tuning levers $A_{kj}$ of the individual segments are obtained:

$$A_{11} = -\frac{n_{1g}L_1}{n_{3g}L_3 - n_{4g}L_4 - n_{1g}L_1}$$

$$A_{13} = +\frac{n_{3g}L_3}{n_{3g}L_3 - n_{4g}L_4 - n_{1g}L_1}$$

$$A_{14} = -\frac{n_{4g}L_4}{n_{3g}L_3 - n_{4g}L_4 - n_{1g}L_1}$$

$$A_{1,j} = 0 \quad (\text{for } j = 2\text{-}5)$$

$$A_{21} = -\frac{n_{1g}L_1}{n_{2g}L_2 - n_{1g}L_1}$$

$$A_{22} = +\frac{n_{2g}L_2}{n_{2g}L_2 - n_{1g}L_1}$$

$$A_{2,j} = 0 \quad (\text{for } j = 3\text{-}5)$$

If desired, the effective tuning lever of a laser segment can be adjusted (decreased) by putting a drive electrode over a portion of the full segment length. Thus, branches 30 and 32 tune the coarse filter (in opposite directions). Branches 30, 26 and 50 tune the fine filter, also in different directions. The transmission peaks of the two interferometers tune as follows $$\Delta F_i = \sum_{j=1}^{5} \frac{\partial F_i}{\partial n_j} \Delta n_j = -F_i \sum_{j=1}^{5} A_{ij}\left[\frac{\Delta n_j}{n_{j,g}}\right]$$

Tunings of the two filters are decoupled if the fine filter is tuned independently with branch 50 and the coarse filter with branch 32. There are two different ways to tune the embodiment of FIG. 4. One can tune the coarse filter to reach the desired frequency range and then tune the fine filter to reach the desired channel. This is the case of "digital" tuning with a two "digit" resolution: the fine filter is the least significant "digit", and the coarse filter is the most significant "digit". Alternatively, one can tune the two filters in synchronism so that the laser tunes smoothly from mode to mode. The two filters tune in synchronism when $\Delta F_1 = \Delta F_2$. For tuning with branches 50 and 32, then the following relationship applies:

$$\Delta F_1 = -(F_1/n_{3g})A_{13}\Delta n_3 \text{ and}$$
$$\Delta F_2 = -(F_2/n_{2g})A_{22}\Delta n_2.$$

If tuning is started with $F_1 = F_2$ at the laser mode, the following condition for synchronous tuning occurs:

$$\frac{\Delta n_2}{\Delta n_3} = \left[\frac{n_{2g}}{n_{3g}}\right]\left[\frac{A_{13}}{A_{22}}\right] =$$

$$\frac{L_3}{L_2}\left[\frac{n_{2g}L_2 - n_{1g}L_1}{n_{3g}L_3 - n_{4g}L_4 - n_{1g}L_1}\right] = r_{23}$$

The laser can be designed so that the tuning ratio $r_{23}$ is positive. In that case, synchronous "single knob" tuning can be achieved by driving the electrodes for the two branches 50 and 32 from a single electrical source through a passive resistive splitter.

It will be appreciated that those skilled in the art will be able to devise numerous arrangements which, although not explicitly shown or described herein, embody the principles of the invention. Accordingly, all such alternatives, modifications and variations which fall within the spirit and broad scope of the appended claims will be embraced by the principles of the invention.

I claim:

1. An optical device comprising
   a first optical branch waveguide having a first and a second end,
   a second optical branch waveguide having a first and a second end,
   a third optical branch waveguide having a first and a second end and a path length that is greater than the path length of the second optical branch waveguide,
   an optical Y-junction element coupling the second end of the first optical branch waveguide to the first end of the second and the first end of the third optical branch waveguides, the second end of the second optical branch waveguide and the second end of the third optical branch waveguide terminating at a common plane that is perpendicular to the longitudinal axis of the second and third optical branch waveguides, wherein the second ends of the second and third optical branch waveguides which terminate at a common plane each have a reflecting end surface.

2. The optical device of claim 1 comprising
a fourth optical branch waveguide having a first and a second end,
a fifth optical branch waveguide having a first and a second end, the second end of the fifth optical branch waveguide terminating at the common plane that is perpendicular to the second and third optical branch waveguides, the fifth optical branch waveguide having a path length that is longer than the path length of the third optical branch waveguide, and
a second Y-function element coupling the second end of the fourth optical branch waveguide to the first end of the first optical branch waveguide and to the first end of the fifth optical branch waveguide, 3. The optical device of claim 2
wherein
at least a part of one of said optical branch waveguides has an active portion, and
the second ends of the second, third and fifth optical branch waveguides which terminate at a common plane each has a reflecting end surface.

4. The optical device of claim 3
wherein
the first end of the fourth optical branch waveguide has a reflecting end surface.

5. The optical device of claim 2 further comprising
a first electrode coupled to the first optical branch waveguide,
a second electrode coupled to the second optical branch waveguide,
a third electrode coupled to the third optical branch waveguide,
a fourth electrode coupled to the fourth optical branch waveguide, and
a fifth electrode coupled to the fifth optical branch waveguide.

6. The optical device of claim 5 further comprising
first means for changing the electrical signals to at least one of the first, second and fifth optical branch waveguides, and
second means for changing the electrical signals to at least one of the second and third optical branch waveguides.

7. The optical device of claim 6 further comprising
means for independently changing said first means and said second means.

8. The optical device of claim 6 further comprising
means for changing said first means and said second means simultaneously.

9. An optical device comprising
a first optical branch waveguide having a first and a second end,
a second optical branch waveguide having a first and a second end,
a third optical branch waveguide having a first and a second end and a path length that is greater than the path length of the second optical branch waveguide,
an optical Y-junction element coupling the second end of the first optical branch waveguide to the first end of the second and the first end of the third optical branch waveguides, the second end of the second optical branch waveguide and the second end of the third optical branch waveguide terminating at a common plane that is perpendicular to the longitudinal axis of the second and third optical branch waveguides, wherein the second ends of the second and third optical branch waveguides which terminate at a common plane each has a reflecting end surface and the first end of the first optical branch waveguide has a reflecting end surface.

10. An optical device comprising
a first optical branch waveguide having a first and a second end,
a second optical branch waveguide having a first and a second end,
a third optical branch waveguide having a first and a second end and a path length that is greater than the path length of the second optical branch waveguide,
an optical Y-junction element coupling the second end of the first optical branch waveguide to the first end of the second and the first end of the third optical branch waveguides, the second end of the second optical branch waveguide and the second end of the third optical branch waveguide terminating at a common plane that is perpendicular to the longitudinal axis of the second and third optical branch waveguides,
a first electrode coupled to the first optical branch waveguide,
a second electrode coupled to the second optical branch waveguide, and
a third electrode coupled to the third optical branch waveguide.

11. The optical device of claim 10 further comprising
means for changing the electrical signals applied to one of said electrodes.

12. A laser cavity comprising
a first optical branch waveguide having a first and a second end, at least a portion of the waveguide being active,
a second optical branch waveguide having a first and a second end,
a third optical branch waveguide having a first and a second end and a path length that is longer than the path length of the second optical branch waveguide, said first, second and third optical branch waveguides being located within a cavity, and
an optical Y-junction element coupling the second end of said first optical branch waveguide to the first end of the second and the third optical branch waveguides, and the second end of the second and the third optical branch waveguide terminate at a common plane that is perpendicular to the longitudinal axis of the second and third optical branch waveguides.

13. The laser cavity of claim 12
wherein
the second end of the second optical branch waveguide and the second end of the third optical branch waveguide each has a reflecting surface, and the first end of the first optical branch waveguide has a reflecting surface.

14. The laser cavity of claim 13 comprising
a first electrode coupled to excite the active portion of the first optical branch waveguide,
a second electrode coupled to the second optical branch waveguide, and
a third electrode coupled to the third optical branch waveguide.

* * * * *